United States Patent
Tanzify Foomany et al.

(10) Patent No.: US 10,084,456 B2
(45) Date of Patent: Sep. 25, 2018

(54) PLURALITY VOTER CIRCUIT

(71) Applicants: Mohsen Tanzify Foomany, Tehran (IR); Keivan Navi, Tehran (IR); Omid Hashemipour, Tehran (IR); Mohammad Hossein Moaiyeri, Tehran (IR)

(72) Inventors: Mohsen Tanzify Foomany, Tehran (IR); Keivan Navi, Tehran (IR); Omid Hashemipour, Tehran (IR); Mohammad Hossein Moaiyeri, Tehran (IR)

( * ) Notice: Subject to any disclaimer, the term of this patent is extended or adjusted under 35 U.S.C. 154(b) by 0 days.

(21) Appl. No.: 15/627,038

(22) Filed: Jun. 19, 2017

(65) Prior Publication Data

US 2017/0359074 A1    Dec. 14, 2017

Related U.S. Application Data

(60) Provisional application No. 62/351,924, filed on Jun. 18, 2016.

(51) Int. Cl.
  *H03K 19/23* (2006.01)
  *H03K 19/003* (2006.01)

(52) U.S. Cl.
  CPC .................... *H03K 19/23* (2013.01)

(58) Field of Classification Search
  CPC ...................................... H03K 19/23
  USPC ................................ 326/11, 35, 36
  See application file for complete search history.

(56) References Cited

U.S. PATENT DOCUMENTS

| | | | |
|---|---|---|---|
| 6,247,160 | B1 | 6/2001 | Davidsson et al. |
| 7,406,608 | B2 * | 7/2008 | Joshi .................. G06F 13/4217 326/11 |
| 7,965,098 | B2 | 6/2011 | Wood et al. |
| 8,570,061 | B2 | 10/2013 | Golke |
| 2003/0200520 | A1 | 10/2003 | Huggins |

FOREIGN PATENT DOCUMENTS

| | | |
|---|---|---|
| CN | 1588856 A | 3/2005 |
| CN | 104317804 A | 1/2015 |
| EP | 1159693 A2 | 12/2001 |

OTHER PUBLICATIONS

Abbas Karimi et al., Exact Parallel Plurality Voting Algorithm for Totally Ordered Object Space Fault-Tolerant Systems, Pertanika J. Sci. & Technol., 20 (1), 2012, pp. 89-96.
Behrooz Parhami, Voting Algorithms, IEEE Transactions on Reliability, vol. 43, No. 4, Dec. 1994, pp. 617-629.

(Continued)

*Primary Examiner* — Daniel D Chang
(74) *Attorney, Agent, or Firm* — NovoTechIP International PLLC

(57) ABSTRACT

A plurality voter circuit is disclosed. The plurality voter circuit includes an input array, an output, a control unit, a priority unit and a bypass unit. The output includes an element of the input array with the highest plurality in the input array, which is an output of the bypass unit. The input array is loaded into the control unit and the bypass unit. In addition, the control unit, the priority unit and the bypass unit are electrically connected.

24 Claims, 14 Drawing Sheets

(56) References Cited

OTHER PUBLICATIONS 6.374: Analysis and Design of Digital Integrated Circuits Using HSPICE, Massachusetts Institute of Technology Department of Electrical Engineering and Computer Science, Fall 2002, Issued: Sep. 10, 2002.
Robert Daniels et al., Accelerating Analog Simulation with HSPICE Precision Parallel Technology, White Paper, Sep. 2010, available on: www.synopsys.com.

* cited by examiner

PLURALITY VOTER CIRCUIT

CROSS-REFERENCE TO RELATED APPLICATION

This application claims the benefit of priority from pending U.S. Provisional Patent Application Ser. No. 62/351,924, filed on Jun. 18, 2016, and entitled "A PLURALITY VOTING ALGORITHM CIRCUIT AND DESIGN THEREOF USING FIELD-EFFECT TRANSISTORS BASED ON CARBON NANOTUBES," which is incorporated herein by reference in its entirety.

TECHNICAL FIELD

The present disclosure generally relates to electronic circuits, and more particularly to a plurality voter circuit.

BACKGROUND

Voting algorithms are commonly implemented in fault tolerant systems that have to operate correctly in the event of possible failure in one or more of their components, such as systems that must operate without interruption even during maintenance. In these types of systems, the required outputs are generated in several system components, and are loaded to a voter unit as inputs, in which a voting is performed among the different inputs to determine the correct result. The most common voting scheme is majority voting, which generally refers to accepting a result from among different inputs based on an input that has more votes than those of all other inputs combined. In other words, majority voting accepts the result correlating to the input that has more than half of all votes. The implementation of majority voting algorithm is rather straightforward, since there can only be one input with a majority vote in any system. Therefore, majority voting can be implemented on hardware without much complexity,

SUMMARY

In one general aspect, the present disclosure describes a plurality voter circuit, including: an input array, an output, a control unit, a priority unit and a bypass unit. The output may include a element of the input array with the highest plurality in the input array and the output may be a bypass unit output. The input array may be loaded into the control unit and into the bypass unit. The control unit, the priority unit and the bypass unit may be electrically connected.

The above general aspect may include one or more of the following features. The number of elements of the input array may be an odd number equal or greater than 3. The input array may include a plurality of analog electrical signals.

In one implementation, the control unit may include a comparator unit, a counter unit and a voter unit. The comparator unit, the counter unit, and the voter unit may be electrically connected In an exemplary implementation, the input, array may be loaded to the comparator unit and the comparator unit may include a first comparator circuit for a first pair of elements from the input array, a second comparator circuit for a second pair of elements from the input array, a third comparator circuit for a third pair of elements from the input array and a fourth comparator circuit for a fourth pair of elements from the input array. The counter unit may include a first counter circuit for a first element of the input array and a second counter circuit for a second element of the input array. The voter unit may include a voter circuit for each element of the input array.

In an exemplary implementation, the first comparator circuit may include the first pair of elements from the input array, two op-amps, a first two-input NAND gate and a first comparator output. The first pair of elements from the input array may include a first comparator input and a second comparator input. The two op-amps may include a first op-amp, where a first reference signal and an average of the first comparator input and the second comparator input may be loaded to the first op-amp and a second op-amp, where a second reference signal and an average of the first comparator input and the second comparator input may be loaded to the second op-amp. The first two-input NAND gate may have two inputs including the first op-amp output and the second op-amp output and the first comparator output may include the first two-input NAND gate output. The first reference signal may include the sum of the first comparator input and a threshold signal and the second reference signal may include the sum of the second comparator input and the threshold signal.

In an exemplary implementation, the second comparator circuit may include the second pair of elements from the input array, two op-amps, a second two-input NAND gate and a second comparator output. The second pair of elements from the input array may include the first comparator input and a third comparator input. The two op-amps may include a third op-amp and a fourth op-amp, where the first reference signal and an average of the first comparator input and the third comparator input may be loaded to the third op-amp. Moreover, a third reference signal and an average of the first comparator input and the third comparator input may be loaded to the fourth op-amp. The second two-input NAND gate may have two inputs including the third op-amp and the fourth op-amp outputs and the second comparator output may include the second two-input NAND gate output. The third reference signal may include the sum of the threshold signal and the third comparator input.

In an exemplary implementation, the third comparator circuit may include the third pair of elements from the input array, two op-amps, a third two-input NAND gate and a third comparator output. The third pair of elements from the input array may include a fourth comparator input and a fifth comparator input. The two op-amps may include a fifth op-amp and a sixth op-amp, where a fourth reference signal and an average of the fourth comparator input and the fifth comparator input may be loaded to the fifth op-amp. Also, a fifth reference signal and an average of the fourth comparator input and the fifth comparator input may be loaded to the sixth op-amp. The third two-input NAND gate may have two inputs including the fifth op-amp output and the sixth op-amp output and the third comparator output may include the third two-input NAND gate output. In an example, the fourth reference signal may include the sum of the threshold signal and the fourth comparator input and the fifth reference signal may include the sum of the threshold signal and the fifth comparator input.

In an exemplary implementation, the fourth comparator circuit may include the fourth pair of elements from the input array, two op-amps, a fourth two-input NAND gate and a fourth comparator output. The fourth pair of elements from the input array may include the fourth comparator input and a sixth comparator input. The two op-amps may include a seventh op-amp and an eighth op-amp, where the fourth reference signal and an average of the fourth comparator input and the sixth comparator input may be loaded to the seventh op-amp and a sixth reference signal and an average of the fourth comparator input and the sixth comparator input may be loaded to the eighth op-amp. The fourth two-input NAND gate may have two inputs, including the seventh op-amp and the eighth op-amp outputs and the fourth comparator output may include the fourth two-input NAND gate output. The sixth reference signal may include the sum of the threshold signal and the sixth counter input.

In an exemplary implementation, the first counter circuit may include a first plurality of counter inputs, a first AND gate, a second AND gate, a first OR gate, a second OR gate, a first plurality of counter outputs and a first counter output. The first plurality of counter inputs may include the first comparator output and the second comparator output and may be loaded into the first AND gate. Also, half or more elements of the first plurality of counter inputs being less than all of the first plurality of counter inputs may be loaded into the second AND gate. The inputs of the first OR gate may include the second AND gate output and the second OR gate inputs may include the first plurality of counter inputs. The first plurality of counter outputs may include the first AND gate output and the first OR gate output and the first counter output may include the second OR gate output.

In some implementations, the first counter circuit may further include a third AND gate, a third OR gate and a second counter output. The third AND gate inputs may include two or more and less than half of the first plurality of counter inputs, the third OR gate inputs may include the third AND gate output and the second counter output may include the third OR gate output.

In an exemplary implementation, the second counter circuit may include a second plurality of counter inputs, a fourth AND gate, a fifth AND gate, a fourth OR gate, a fifth OR gate, a third counter output, a fourth counter output and a fifth counter output. The second plurality of counter inputs may include the third comparator output and the fourth comparator output The fourth AND gate inputs may include the second plurality of counter inputs and the fifth AND gate inputs may include two or more and less than all of the second plurality of counter inputs. The fourth OR gate inputs may include the fifth AND gate output and the fifth OR gate inputs may include the second plurality of counter inputs. The third counter output may include the fourth AND gate output, the fourth counter output may include the fourth OR gate output and the fifth counter output may include the fifth OR gate output.

In some implementations, the second counter circuit may further include a sixth AND gate, a sixth OR gate and a sixth counter output. The sixth AND gate may have more inputs than the third AND gate inputs and the sixth AND gate inputs may include three or more of the second plurality of counter inputs. The sixth OR gate inputs may include the sixth AND gate output and the sixth counter output may include the sixth OR gate output.

In an exemplary implementation, the voter circuit may include a first plurality of voter inputs, a second plurality of voter inputs, a first voter input, a first NOR gate, a seventh AND gate, a seventh OR gate and a voter output. The first plurality of voter inputs may include the first plurality of counter outputs and the second plurality of voter inputs may include the third counter output and the fourth counter output. The first voter input may include the first counter output. Moreover, the first NOR gate inputs may include the second plurality of voter inputs and the seventh AND gate inputs may include the first NOR gate output and the first voter input. The seventh OR gate inputs may include the first plurality of voter inputs and the seventh AND gate output. The voter output may include the seventh OR gate output.

In some implementations, the voter circuit may further include a second voter input, a third voter input a second NOR gate and an eighth AND gate. The second voter input may include the second counter output and the third voter input may include the sixth counter output The second NOR gate inputs may include the third voter input and the eighth AND gate inputs may include the second NOR gate output and the second voter input In an example, the seventh OR gate inputs may further include the eighth AND gate output.

In an exemplary implementation, the priority unit may include a plurality of priority inputs, a priority output, a ninth AND gate, a plurality of priority outputs and a plurality of priority outputs. The plurality of priority inputs may include the voter output and the priority output may include one of the plurality of priority inputs. The ninth AND gate inputs may include one of the plurality of priority inputs and a number of inverted values of the plurality of priority inputs. The plurality of priority outputs may include the ninth AND gate output.

In an exemplary implementation, the bypass unit may include a first plurality of bypass inputs, a second plurality of bypass inputs, a plurality of pass-transistors and a common node that may be connected to drains of the plurality of pass-transistors. The first plurality of bypass inputs may include the input array and the second plurality of bypass inputs may include the priority output and the plurality of priority outputs.

In some implementations, each of the first plurality of bypass inputs may be connected to a source of each of the plurality of pass-transistors. Furthermore, each of the second plurality of bypass inputs may be connected to a gate of each of the plurality of pass-transistors. The common node may be connected to the output.

In some implementations, the logic elements and transistors may include a metal-oxide-semiconductor field-effect transistor (MOSFET), or a carbon nanotube field-effect transistor (CNFET), or a fin field-effect transistor (FinFET).

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

As described above, various voting schemes may be implemented in fault tolerant systems. One important voting scheme is plurality voting, which may be understood as an extension of majority voting. However, unlike majority voting, any input that has more votes than those of other inputs may be selected as the voting result in plurality voting, and so the constraint of obtaining more than half of the votes is removed. Thus, in some cases, more than one voting result, with an equal number of votes, may be generated, which implies that the votes of all inputs should be counted, stored in memory, and compared with each other. Furthermore, a priority scheme may be required to select the result from different inputs with a certain number of votes. These issues potentially increase the complexity of the hardware implementing the plurality voting algorithms, which can decrease the reliability of the voting unit. This is a major challenge in hardware implementation of plurality voting, since the voting result should be reliable enough to compensate for possible failures of other system components. Generally, voting algorithms should be implemented on robust hardware to protect against various sources of error. The situation becomes more critical for "inexact" voting, that is, when inputs with "equal" values may not be exactly equal, but close enough to be considered equal. In this case, analog electronics may also be required to implement the voting process, which can further increase the complexity and sensitivity of the hardware needed.

There is a need for a hardware implementation of a plurality voting algorithm with low complexity and high reliability to be used in systems where plurality voting is required to determine the correct result. There is further a need for hardware implementation of a plurality voting algorithm with the ability of performing inexact voting among different inputs. Furthermore, a need exists for an electronic circuit for plurality voting with low complexity and high reliability, capable of processing both analog and digital signals to perform exact and inexact voting among different inputs.

Disclosed herein is a novel plurality voting circuit with a plurality voting algorithm. The present disclosure describes a design and simulation of a plurality voting algorithm at a gate level and also at a circuit level including transistor elements. There is no restriction regarding the number of inputs or applied voltage for the following disclosed circuit.

Figure 1:
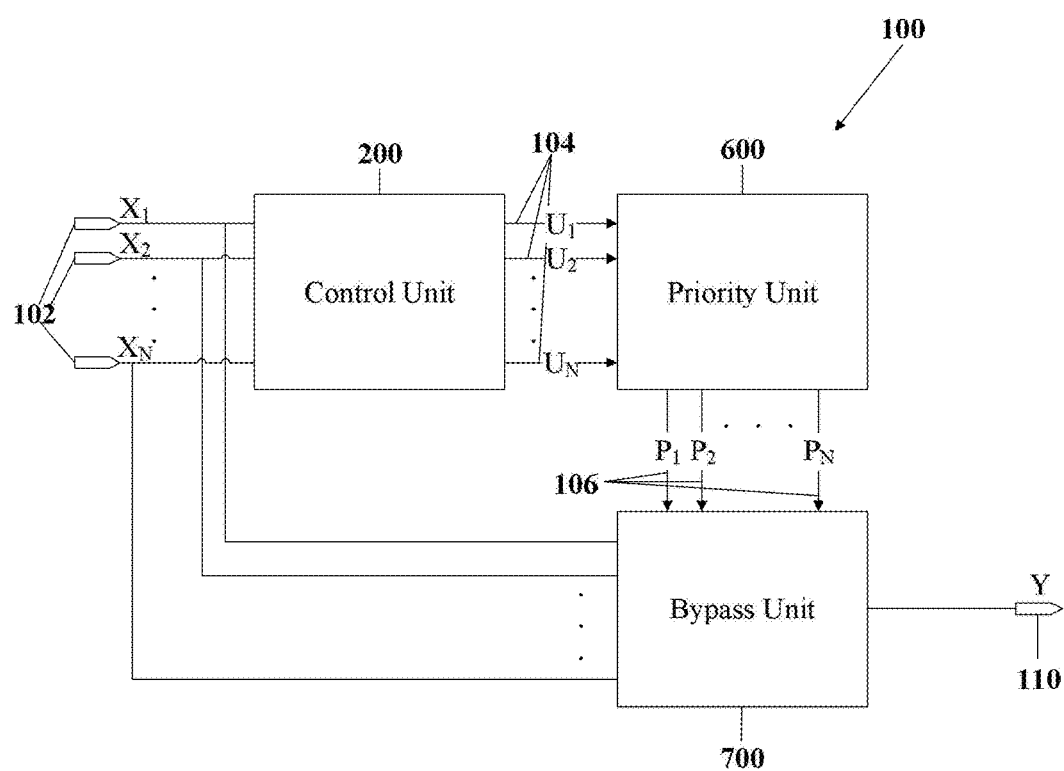
FIG. 1 illustrates a block diagram of an example plurality voter circuit with N inputs, according to one or more implementations of the present disclosure.

FIGS. 1-7 depict a series of implementations of the disclosed voting algorithm and circuit. For example, FIG. 1 presents a block diagram of an implementation of a plurality voter circuit 100 with N inputs. In one implementation, the plurality voter circuit 100 includes an input array 102, a control unit 200, a priority unit 600 a bypass unit 700, and an output 110. The input array 102 can include various arrays, such as an array of $X_1$-$X_N$. In addition, the output 110 can include an element of the input array 102 with the highest plurality in the input array 102. The outputs of the control unit 200, for example $U_1$-$U_N$, can be referred to as control unit outputs 104, and in some implementations may be loaded to the priority unit 600. In some implementations, the bypass unit 700 may be associated with two sets of inputs, including the input array 102, and the outputs of the priority unit 600. Outputs of the priority unit 600 can comprise for example $P_1$-$P_N$, and may be referred to as priority unit output 106. The output 110, for example Y, includes the priority unit output 106 of the priority unit 600. In different implementations, the control unit, the priority unit and/or the bypass unit may be electrically connected. Furthermore, in some implementations, the number of elements (N) of the input array 102 may be any odd number equal to 3 or greater than 3, which is a prerequisite of plurality voting. The input array 102 may include analog signals to enable inexact voting in one implementation.

Figure 2:
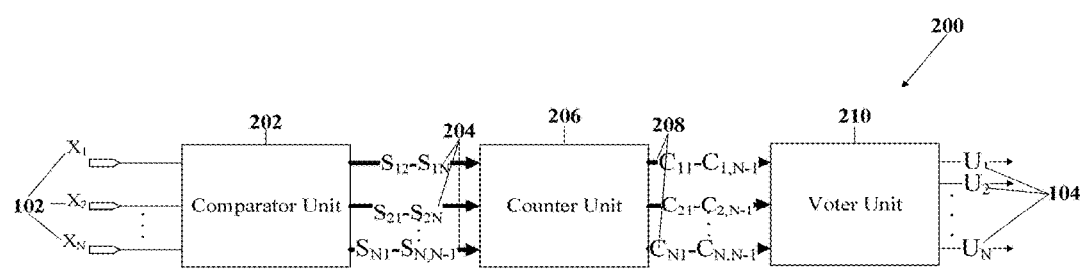
FIG. 2 illustrates a block diagram of one example control unit for the plurality voter circuit with N inputs, according to one or more implementations of the present disclosure.

FIG. 2 illustrates a block diagram of an implementation of the control unit 200 for the plurality voter circuit with N inputs. In FIG. 2, the control unit 200 includes a comparator unit 202, a counter unit 206, and a voter unit 210. Referring to FIG. 2, the input array 102 may be loaded to the comparator unit 202 in one implementation In some implementations, the comparator unit 202 may include at least four comparator circuits according to the inputs of each circuit. For example, the comparator unit 202 may include a first comparator circuit, a second comparator circuit, a third comparator circuit, and/or a fourth comparator circuit to implement the plurality voting algorithm.

Figure 3:
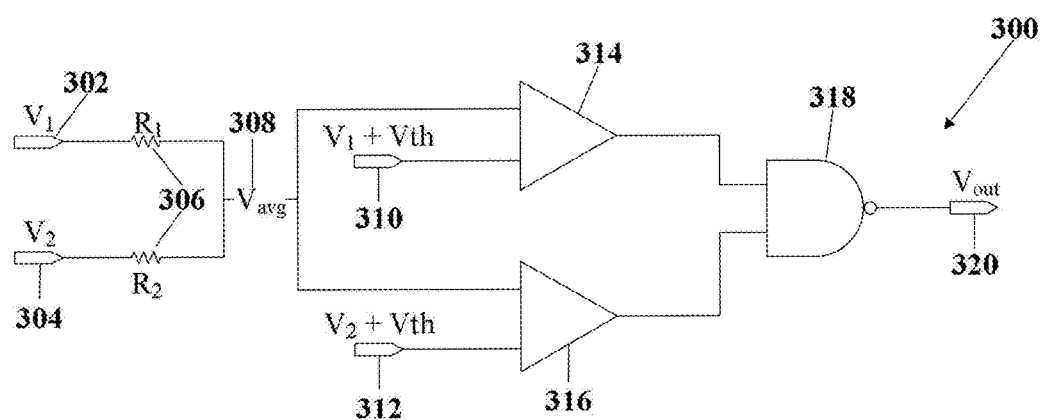
FIG. 3 illustrates a schematic of one example comparator circuit, according to one or more implementations of the present disclosure.

Referring now to FIG. 3, a schematic of an implementation of a comparator circuit 300 is provided. In different implementations, one comparator circuit 300 for each pair of elements from the input array 102 (see FIGS. 1 and 2) may be provided, which may be loaded to the comparator circuit 300 as inputs. In one implementation, a first pair of elements from the input array may be loaded to the first comparator circuit, a second pair of elements from the input array may be loaded to the second comparator circuit, a third pair of elements from the input array may be loaded to the third comparator circuit, and a fourth pair of elements from the input array may be loaded to the fourth comparator circuit.

In some implementations, each comparator circuit 300 may include a respective pair of elements from the input array, two op-amps, a two-input NAND gate, and a comparator output.

As shown in FIG. 3, the first pair of elements from the input array 102, for example, $X_i$ and $X_j$ (see FIG. 2), that are loaded to the first exemplary comparator circuit 300 may include a first comparator input 302, here identified as $V_1$, and a second comparator input 304, here identified as $V_2$. In some implementations, each of these inputs may be an analog voltage to enable inexact voting. By connecting a pair of resistors 306 in series between the first comparator input 302 and the second comparator input 304, an average 308 of the first comparator input 302 and the second comparator input 304 may be obtained (identified as $V_{avg}$ in FIG. 3). In one implementation, the $V_{avg}$ can be expressed as $$V_{avg} = (V_1 + V_2)/2 \quad \text{Equation (1)}$$

In some implementations, the average 308 may be then loaded to two op-amps, for example, a first op-amp 314 and a second op-amp 316, as the first input of each of the op-amps. The second input of the first op-amp 314 may act as a first reference signal 310 and the second input of the second op-amp 316 may act as a second reference signal 312. The first reference signal 310 may include the sum of the first comparator input 302 and a threshold signal $V_{th}$. The threshold signal $V_{th}$ may be selected as being the value equal to the lowest value that can be recognized as a nonzero signal by the two op-amps. Therefore, in some implementations, the exact preferred value of $V_{th}$ may depend on the sensitivity of the electronic components comprising the op-amps. The second reference signal 312 may include the sum of the second comparator input 304 and the threshold signal $V_{th}$. The outputs of the first op-amp 314 and the second op-amp 316 may be loaded to a two-input NAND gate, for example a first two-input NAND gate 318. The output of the first two-input NAND gate 318 may be referred to as a first comparator output 320, which forms the output of the first comparator circuit ($V_3$). This output can be referred to as $S_{ij}$, meaning that it shows the similarity of $X_i$ and $X_j$.

In one implementation, the relationship between the first comparator input 302, the second comparator input 304, and the first comparator output 320 may be expressed as:

$$\text{if} \begin{cases} V_{avg} < V_1 + V_{th}(\text{i.e. } V_1 - V_2 > -2V_{th}) \to V_{o1=1} \\ V_{avg} > V_2 + V_{th}(\text{i.e. } V_1 - V_2 < 2V_{th}) \to V_{o2=1} \end{cases} \Rightarrow V_3 = 0 \quad \text{Equation (2)}$$

$$\therefore |V_{in1} - V_{in2}| < 2V_{th} \Rightarrow V_3 = 0$$

In Equation (2) above, $V_{o1}$ is the output of the first op-amp 314 and $V_{o2}$ is the output of the second op-amp 316. Equation (2) shows that the first comparator output 320 may become logic 0 if the difference of the values of the first comparator input 302 and the second comparator input 304 is smaller than the threshold signal $V_{th}$, which implies that the two comparator inputs may be considered equal.

In FIG. 3, the second pair of elements from the input array 102 may include the first comparator input 302 (also referred to as $X_i$) as well as a third comparator input such as $X_k$ (not shown) from the input array 102. In other words, the first comparator circuit and the second comparator circuit may have one common input, $X_i$. As described above with reference to the first comparator circuit, the second comparator circuit may include two op-amps. For example, the second comparator circuit can include a third op-amp (similar to the first op-amp 314 of the first comparator circuit), and a fourth op-amp (similar to the second op-amp 316 of the first comparator circuit). An average of the first comparator input 302 and the third comparator input may be loaded to the third op-amp and fourth op-amp, as a first input of each of the op-amps. The first reference signal 310 may be loaded to the third op-amp as a second input. It should be noted that this signal may comprise a common input to the first op-amp 314 of the first comparator circuit and the third op-amp of the second comparator circuit, as the signal represents the sum of the threshold signal $V_{th}$ and the first comparator input 302, where the first comparator input 302 comprises a common input ($X_i$) for the first comparator circuit and second comparator circuit. A third reference signal (similar to the second reference signal 312 of the first comparator circuit) representing the sum of the threshold signal and the third comparator input may be loaded to the fourth op-amp as a second input. The outputs of the third op-amp and fourth op-amp may be loaded to a second two-input NAND gate (similar to the first two-input NAND gate 318 in the first comparator circuit). The output of the second two-input NAND gate may be referred to as a second comparator output (similar to the first comparator output 320 in the first comparator circuit), which forms the output of the second comparator circuit, and may be referred to as $S_{ik}$, meaning that it shows the similarity of $X_i$ and $X_k$.

In FIG. 3, referring to the third comparator circuit, the third pair of elements from the input array 102 may include a fourth comparator input ($X_m$) and a fifth comparator input ($X_l$), where m≠i and where the first input of the third comparator circuit may be different from the first inputs of the first comparator circuit and second comparator circuit. Similar to the first comparator circuit and second comparator circuit, the third comparator circuit may include two op-amps. For example, the third comparator circuit can include a fifth op-amp and a sixth, op-amp (similar to the first op-amp 314 and the second op-amp 316 of the first comparator circuit). An average of the fourth comparator input and the fifth comparator input may be loaded to the fifth op-amp and sixth op-amp as a first input of each of the op-amps. In addition, a fourth reference signal may be loaded to the fifth op-amp and a fifth reference signal may be loaded to the sixth op-amp, providing second inputs. The fourth reference signal may represent the sum of the threshold signal $V_{th}$ and the fourth comparator input, and the fifth reference signal may represent the sum of the threshold signal $V_{th}$ and the fifth comparator input. The outputs of the fifth op-amp and sixth op-amp may be loaded to a third two-input NAND gate (similar to the first two-input NAND gate 318 in the first comparator circuit). The output of the third two-input NAND gate can be referred to as a third comparator output (similar to the first comparator output 320 in the first comparator circuit), which forms the output of the third comparator circuit. The output of the third comparator circuit can be referred to by $S_{ml}$, meaning that it shows the similarity of $X_m$ and $X_l$.

With reference to the fourth comparator circuit, the fourth pair of elements from the input array 102 may include the fourth comparator input ($X_m$) and a sixth comparator input, for example $X_n$, from the input array 102. In other words, the third comparator circuit and fourth comparator circuit may have one common input, $X_m$, which differs from the first comparator input 302 ($X_i$) of the first comparator circuit and second comparator circuit. Similar to the third comparator circuit, the fourth comparator circuit may include two op-amps. For example, the fourth comparator circuit can comprise a seventh op-amp (similar to the first op-amp 314 of the first comparator circuit), and an eighth op-amp (similar to the second op-amp 316 of the first comparator circuit). An average of the fourth comparator input and the sixth comparator input may be loaded to the seventh op-amp and eighth op-amp as a first input of each of the op-amps. The fourth reference signal may be loaded to the seventh op-amp as a second input. It should be noted that this signal is a common input to the fifth op-amp of the third comparator circuit and the seventh op-amp of the fourth comparator circuit, being the sum of the threshold signal $V_{th}$ and the fourth comparator input, which is a common input $(X_m)$ for the third comparator circuit and fourth comparator circuit. A sixth reference signal representing the sum of the threshold signal and the sixth comparator input may be loaded to the eighth op-amp as a second input. The outputs of the seventh op-amp and eighth op-amp may be loaded to a fourth two-input NAND gate (similar to the first two-input NAND gate 318 in the first comparator circuit). The output of the fourth two-input NAND gate may be referred to as a fourth comparator output (similar to the first comparator output 320 in the first comparator circuit), which forms the output of the fourth comparator circuit and may be referred to as $S_{mn}$, meaning that it shows the similarity of $X_m$ and $X_n$.

Referring to both FIGS. 2 and 3, in different implementations, each output 320 of the comparator circuit 300 may include one element of the comparator unit outputs 204. Furthermore, each element of the input array 102 may be compared with every other element of the input array 102, by one comparator circuit 300 for each comparison. Therefore, for every element of the input array 102 (for example $X_i$), N−1 elements of the comparator unit outputs 204 (for example $S_{i1}, S_{i2}, \ldots, S_{i,i-1}, S_{i,i+1}, \ldots, S_{iN}$) may be generated. The comparator unit outputs 204 may then be loaded to the counter unit 206 as the counter unit inputs.

In some cases, the counter unit 206 may include at least two implementations of counter circuits (based on the functionality of each circuit). For example, a first counter circuit and a second counter circuit can be utilized to implement the plurality voting algorithm.

Figure 4:
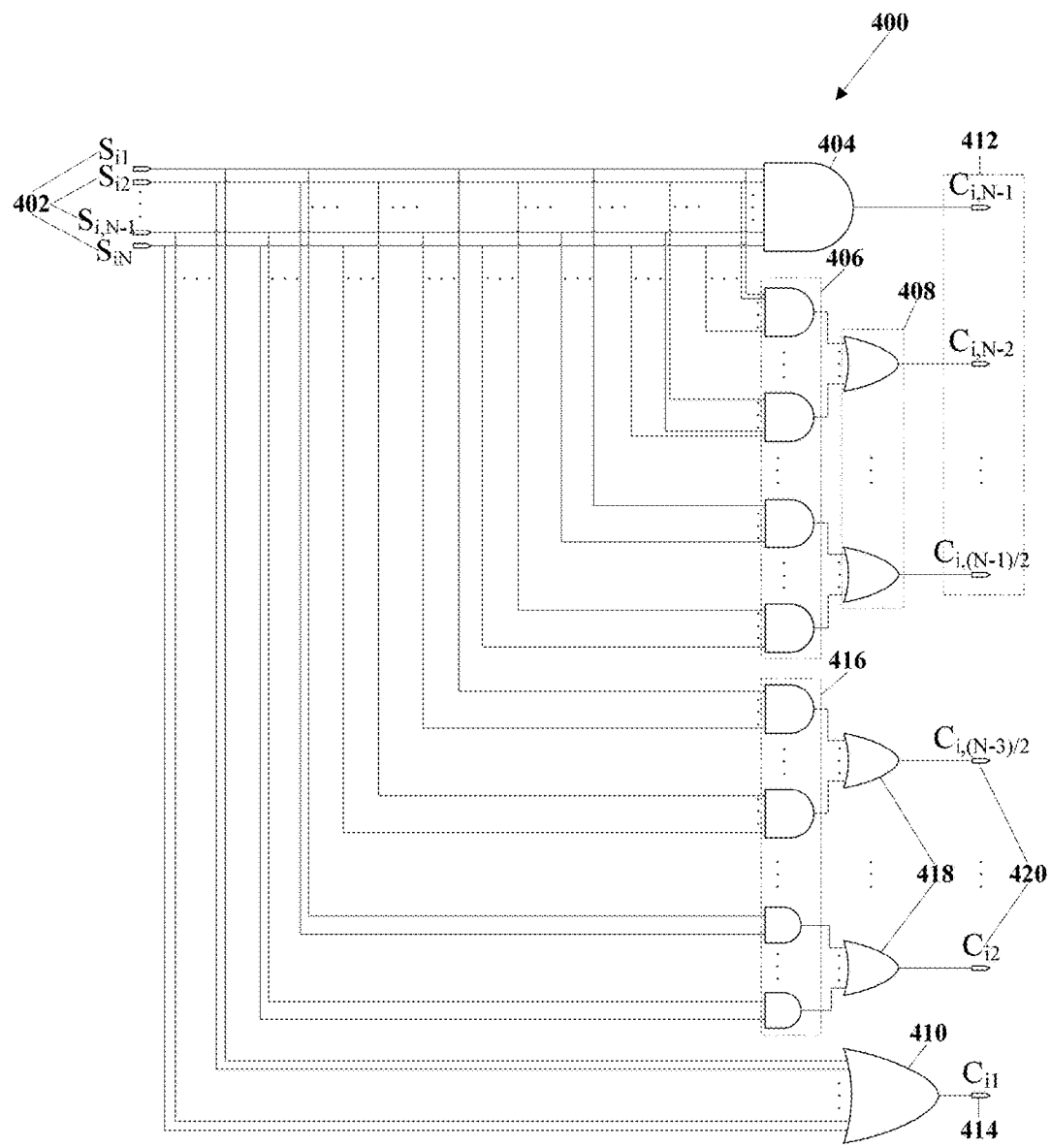
FIG. 4 illustrates a schematic of one example counter circuit for the plurality voter circuit with N inputs, according to one or more implementations of the present disclosure.

Referring now to FIG. 4, a schematic of an implementation of a counter circuit 400 for the plurality voter circuit 100 with N inputs (see FIG. 1) is shown. In some implementations, one counter circuit 400 for every element of the input array 102 (see FIG. 2) may be provided. In some implementations, for an element $X_i$ from the input array 102, N−1 elements from the comparator unit outputs 204 (for example $S_{i1}, S_{i2}, \ldots, S_{i,i-1}, S_{i,i+1}, \ldots, S_{iN}$) of FIG. 2 may be generated by comparator circuits having $X_i$ as their first input. These elements may be loaded to a corresponding counter circuit 400 as inputs. It may be assumed that the first counter circuit corresponds to a first element of the input array, and the second counter circuit corresponds to a second element of the input array.

In FIG. 4, inputs of the first counter circuit may include a first plurality of counter inputs 402, including the first comparator output 320 ($S_{ij}$) (see FIG. 3) and the second comparator output ($S_{ik}$). Therefore, the first plurality of counter inputs 402 may include all outputs of comparator circuits with a common first input $X_i$, for example $S_{i1}, S_{i2}, \ldots, S_{i,i-1}, S_{i,i+1}, \ldots, S_{iN}$. The first plurality of counter inputs 402 may be loaded to an AND gate, for example a first AND gate 404. The output of the first AND gate 404 may be logic value 1 when all of the elements of the input array are considered equal. The first counter circuit may include another implementation of AND gate, for example a second AND gate 406. Half or more and less than all of the first plurality of counter inputs may be loaded to the second AND gate 406. The output of the second AND gate 406 may be loaded to an OR gate, for example a first OR gate 408. In one implementation, the first counter circuit may include (N−1)/2 samples of the first OR gate 408, each having $$\binom{N-1}{K}$$

number of inputs, where (N−1)/2≤K<N−1. In other words, every sample of the first OR gate 408 may be loaded by outputs of all samples of the second AND gate 406 with equal number of inputs that may be half or more of the first plurality of counter inputs 402. The output of the first OR gate 408 may be logic 1 when half or more elements of the input array 102 are considered equal. The first counter circuit may include another OR gate, for example a second OR gate 410 that may be loaded with the first plurality of counter inputs 402. The output of the second OR gate 410 may be logic 1 when at least two elements of the input array 102 are considered equal.

Outputs of the first AND gate 404 and the first OR gate 408 may be referred to as a first plurality of counter outputs 412 (or $C_{ip}$, where i refers to the corresponding element $X_i$ from the input array 102 loaded to the first comparator circuit and second comparator circuit as the first comparator input 302), and (N−1)/2≤p≤N−1 is the number of elements (other than $X_i$) from the input array 102 that are considered equal to $X_i$. The output of the second OR gate 410 may be referred to as a first counter output 414 ($C_{i1}$) that shows whether $X_i$ is considered equal to at least one other element from the input array 102.

When the number of elements of the input array 102 (N) is larger than 5—that is, plurality voting is to be performed among at least 7 input elements—the first counter circuit may further include another implementation of AND gate. For example, a third AND gate 416, which may be loaded with two or more and less than half of the first plurality of counter inputs 402. The output of the third AND gate 416 may be loaded to an OR gate, for example a third OR gate 418. The first counter circuit may include (N−1)/2 samples of the third OR gate 418, each having $$\binom{N-1}{K}$$

number of inputs, where 2≤K<(N−1)/2 . In other words, every sample of the third OR gate 418 may be loaded with outputs of all samples of the third AND gate 416 with an equal number of inputs that may include two or more and less than half of the first plurality of counter inputs 402. The output of the third OR gate 418 may be logic 1 when three or more elements of the input array 102 are considered equal. The output of the third OR gate 418 may be referred to as a second counter output 420 ($C_{ip}$, where i refers to the corresponding element $X_i$ from the input array 102 loaded to the first comparator circuit and second comparator circuit as the first comparator input 302), and 2≤p≤(N−3)/2 is the number of elements (other than $X_i$) from the input array 102 that are considered equal to $X_i$.

In different implementations, inputs of the second counter circuit may include a second plurality of counter inputs (similar to the first plurality of counter inputs 402 for the first counter circuit), including the third comparator output ($S_{m1}$) and the fourth comparator output ($S_{mn}$). Therefore, in one implementation, the second plurality of counter inputs may include all outputs of comparator circuits with the common first input $X_m$ (for example $S_{m1}$, $S_{m2}$, ..., $S_{m,m-1}$, $S_{m,m+1}$, ..., $S_{mN}$). Since the first input of the third comparator circuit and fourth comparator circuit ($X_m$) may differ from the first input of the first comparator circuit and second comparator circuit ($X_i$), the second plurality of counter inputs may exclude the first plurality of counter inputs 402. The second plurality of counter inputs may be loaded to an AND gate, for example a fourth AND gate (similar to the first AND gate 404 of the first counter circuit). The output of the fourth AND gate may be logic 1 when all of the elements of the input array 102 are considered equal. The second counter circuit may include an implementation of a fifth AND gate (similar to the second AND gate 406 and the third AND gate 416 of the first counter circuit), that is loaded by two or more and less than all of the second plurality of counter inputs. The output of the fifth AND gate may be loaded to an OR gate, for example a fourth OR gate (similar to the first OR gate 408 and the third OR gate 418 in the first counter circuit). The second counter circuit may include N−3 implementations of the fourth OR gate, each having number $$\binom{N-1}{K}$$

of inputs, where 2≤K<N−1. In other words, every implementation of the fourth OR gate may be loaded with outputs of all implementations of the fifth AND gate with an equal number of inputs, that may be two or more and less than all of the second plurality of counter inputs. The output of the fourth OR gate may be logic 1 when at least three elements of the input array 102 are considered equal. The second counter circuit may include another OR gate, for example a fifth OR gate (similar to the second OR gate 410 of the first counter circuit), that may be loaded with the second plurality of counter inputs. The output of the fifth OR gate may be logic 1 when at least two elements of the input array 102 are considered equal. The output of the fourth AND gate may be referred to as a third counter output, $C_{m,N-1}$ (similar to $C_{1,N-1}$ in the first counter circuit), where m refers to the corresponding element $X_m$ from the input array 102 loaded to the third and fourth comparator circuits as their first input. The output of the fourth OR gate may be referred to as a fourth counter output ($C_{mp}$) which shows whether $X_m$ is considered equal to at least p other elements from the input array 102 where 2≤p≤N−2. The output of the fifth OR gate may be referred to as a fifth counter output $C_{m1}$ (similar to the first counter output 414 $C_{i1}$ in the first counter circuit), which shows whether $X_m$ is considered equal to at least one other element from the input array 102.

When the number of elements (N) of the input array 102 is larger than 5—that is plurality voting is to be performed among at least 7 input elements—the second counter circuit may further include another implementation of AND gate, for example a sixth AND gate (similar to the second AND gate 406 and the third AND gate 416 in the first counter circuit), which may be loaded with three or more of the second plurality of counter inputs. In some implementations, the sixth AND gate may have more inputs than the third AND gate inputs. In other words, for implementations of the third AND gate 416 in the first counter circuit, at least one implementation of the sixth AND gate may be specified in the second counter circuit, so that the number of inputs of the sixth AND gate implementation may exceed the number of inputs of the corresponding third AND gate 416 sample. The sixth AND gate output may be loaded to an implementation of an OR gate, for example a sixth OR gate (similar to the first OR gate 408 and the third OR gate 418 in the first counter circuit). Therefore, for every sample of the second counter output 420 ($C_{ip}$, where i refers to an $X_i$ element of the input array 102 and 2≤p≤(N−3)/2 is the number of elements (other than $X_i$) from the input array 102 that are considered equal to $X_i$) there may exist an output $C_{mq}$ of the sixth OR gate, where m≠i refers to $X_m$ element of the input array 102 and q>p is the number of elements (other than $X_m$) of the input array 102 that are considered equal to $X_m$. The output of the sixth OR gate may be referred to as a sixth counter output.

As shown in FIG. 4, outputs of the first counter circuit, including the first plurality of counter outputs 412, the first counter output 414, and the second counter output 420 (that is $C_{i1}$-$C_{i,N-1}$ where i refers to $X_i$ element from the input array 102), and outputs of the second counter circuit, including the third counter output, the fourth counter output, the fifth counter output, and the sixth counter output (that is $C_{m1}$-$C_{m,N-1}$ where m≠i refers to $X_m$ element from the input array 102) may form the counter unit outputs 208 (for example $C_{11}$-$C_{1,N-1}$, $C_{21}$-$C_{2,N-}1$, ..., $C_{N1}$-$C_{N,N-1}$). In one implementation, the counter unit outputs 208 may be loaded to the voter unit 210. Furthermore, the voter unit 210 may include N voter circuits, including one voter circuit for each element X of the input array 102.

Figure 5:
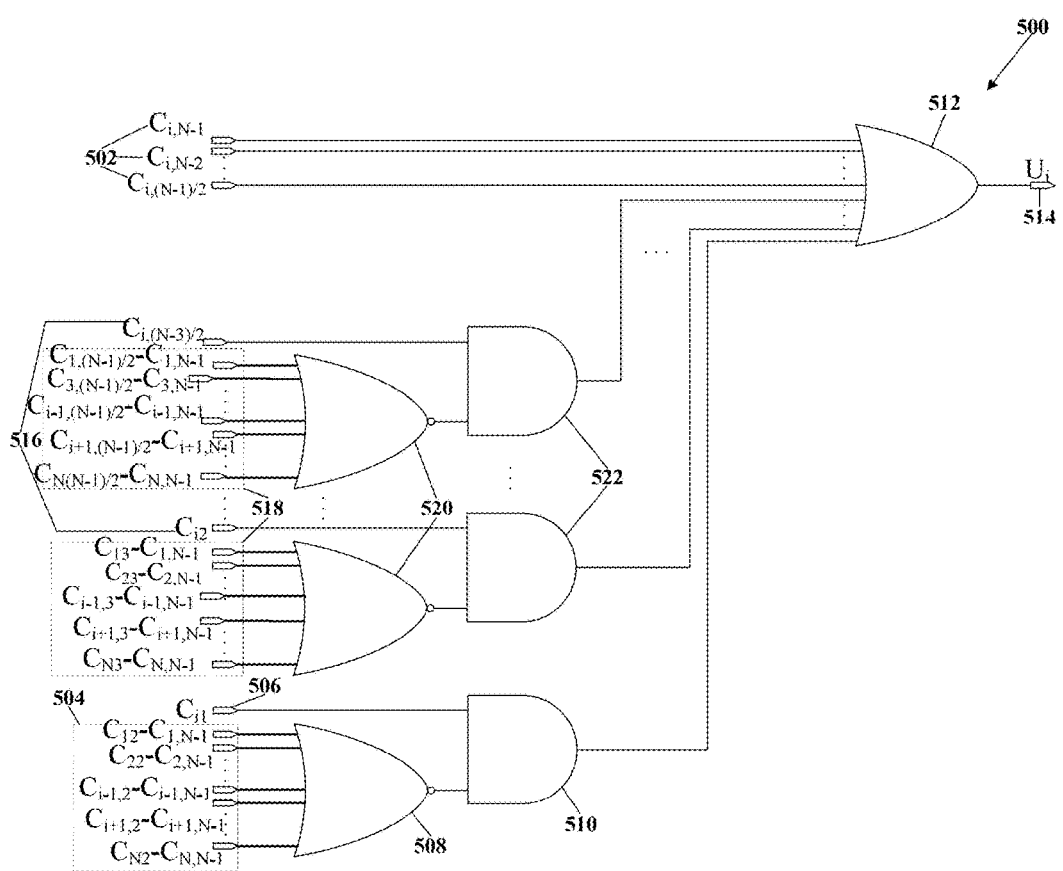
FIG. 5 illustrates a schematic of one example voter circuit for the plurality voter circuit with N inputs, according to one or more implementations of the present disclosure.

Referring now to FIG. 5, a schematic of one example voter circuit 500 is shown. In some implementations, inputs of the voter circuit 500 may include a first plurality of voter inputs 502, which comprise the first plurality of counter outputs 412 (that is $C_{i,(N-1)/2}$, ..., $C_{i,N-2}$, $C_{i,N-1}$ where i refers to the $X_i$ element from the input array 102). Inputs of the voter circuit 500 may also include a second plurality of voter inputs 504, including the third counter output ($C_{m,N-1}$) and the fourth counter output ($C_{mp}$) where m≠i refers to the $X_i$ element from the input array 102 and 2≤p≤N−2 is the number of elements of the input array 102 that may be considered equal to $X_m$. Therefore, the second plurality of voter inputs 504 may include $C_{m2}$, $C_{m3}$, ..., $C_{m,N-1}$ where 1≤m≤N and m≠i. Inputs of the voter circuit 500 may also include a first voter input 506, including the first counter output 414, $C_{i1}$.

The second plurality of voter inputs 504 may be loaded to a NOR gate, for example a first NOR gate 508. For every $X_i$ element of the input array 102, output of the corresponding implementation of the first NOR gate 508 may be logic 0 if any element of the second plurality of voter inputs 504, that is $C_{m2}$, $C_{m3}$, ..., $C_{m,N-1}$ where 1≤m≤N and m≠i, is logic 1. In other words, output of the first NOR gate 508 may be logic 1 if there is no element $X_m$ (other than $X_i$) in the input array 102 that can be considered equal to more than one other element in the input array 102.

The outputs of the first NOR gate 508 and the first voter input 506 $C_{i1}$ may be loaded to an implementation of an AND gate, for example a seventh AND gate 510. The output of the seventh AND gate 510 may be logic 1 if both $C_{i1}$ and the first NOR gate 508 output are logic 1. In other words, in one implementation, if an element $X_i$ in the input array 102 can be considered equal to at least one other element in the input array 102, and there is no other element $X_m$ in the input array 102 that can be considered equal to more than one other element in the input array 102, then the seventh AND gate 510 output may be logic 1. Therefore, the seventh AND gate 510 output may indicate whether $X_i$ can be considered as the plurality voting result when it is equal to at least one other element of the input array 102.

In some implementations, the voter circuit 500 may also include another OR gate, for example a seventh OR gate 512. The first plurality of voter inputs 502 (that is $C_{i,(N-1)/2}, \ldots, C_{i,N-2}, C_{i,N-1}$) and the seventh AND gate 510 output may be loaded to the seventh OR gate 512. The output of the seventh OR gate 512 may be considered a voter output 514 ($U_i$) that may indicate the plurality voting result for the corresponding element $X_i$ of the input array. The voter output 514 may be logic 1 if any of $C_{i,(N-1)/2}, \ldots, C_{i,N-2}, C_{i,N-1}$ is logic 1, that is the element $X_i$ from the input array 102 is considered equal to half or more elements of the input array 102 (which is the majority voting result), or the seventh AND gate 510 output is logic 1, that is the element $X_i$ from the input array 102 is considered equal to at least one other element of the input array 102 (which is the plurality voting result when the input array 102 has N=5 elements).

When the input array 102 includes more than 5 elements—that is plurality voting is to be performed among at least 7 input elements —inputs of the voter circuit 500 may further include a second voter input 516, including the second counter output 420 ($C_{ip}$ where i refers to the corresponding element $X_i$ from the input array 102 and $2 \leq p < (N-1)/2$ is the number of elements (other than $X_i$) of the input array 102 that are considered equal to $X_i$). The voter circuit 500 may further include a third voter input 518, including the sixth counter output $C_{mq}$, where m≠i refers to $X_m$ element of the input array 102 and q>p is the number of elements (other than $X_m$) of the input array 102 that are considered equal to $X_m$. The third voter input 518 may be loaded to an implementation of a NOR gate, for example a second NOR gate 520. For every sample of the second counter output 420 ($C_{ip}$) there may exist a corresponding implementation of the second NOR gate 520. The corresponding second NOR gate 520 output may be logic 0 if any of the corresponding samples of the third voter input 518 (that is $C_{m,p+1}, C_{m,p+2}, \ldots, C_{m,N-1}$) where m ≠i, is logic 1. In other words, output of the second NOR gate 520 may be logic 1 if the number of elements in the input array 102, which may be considered equal to $X_i$, is not smaller than that of any other element ($X_m$) in the input array 102.

In some implementations, the second NOR gate 520 output, and the second voter input 516 ($C_{ip}$) may be loaded to an implementation of an AND gate, for example an eighth AND gate 522. The eighth AND gate 522 output may be logic 1 if both $C_{ip}$ and the second NOR gate 520 output are logic 1. In other words, if an element $X_i$ in the input array 102 can be considered equal to at least p other elements in the input array 102, and there is no other element $X_m$ in the input array 102 that can be considered equal to more than p other elements in the input array 102, then the eighth AND gate 522 output may be logic 1. Therefore, the eighth AND gate 522 output may indicate whether $X_i$ can be considered as the plurality voting result when it is equal to at least p(<(N-1)/2) other elements of the input array 102.

The eighth AND gate 522 may be loaded to the seventh OR gate 512 when the input array 102 has N>5 elements, so that the element $X_i$ from the input array 102 may be the plurality voting result when it is considered equal to at least p<(N-1)/2 other elements of the input array 102 (which is the plurality voting result when the input array 102 has N>5 elements).

Referring back to FIG. 1 and FIG. 2, every sample of the voter output 514 of FIG. 5 may be an element of the outputs of the voter unit 210, $U_1$-$U_N$, which form the control unit outputs 104. The control unit outputs 104 may be loaded to the priority unit 600.

Figure 6:
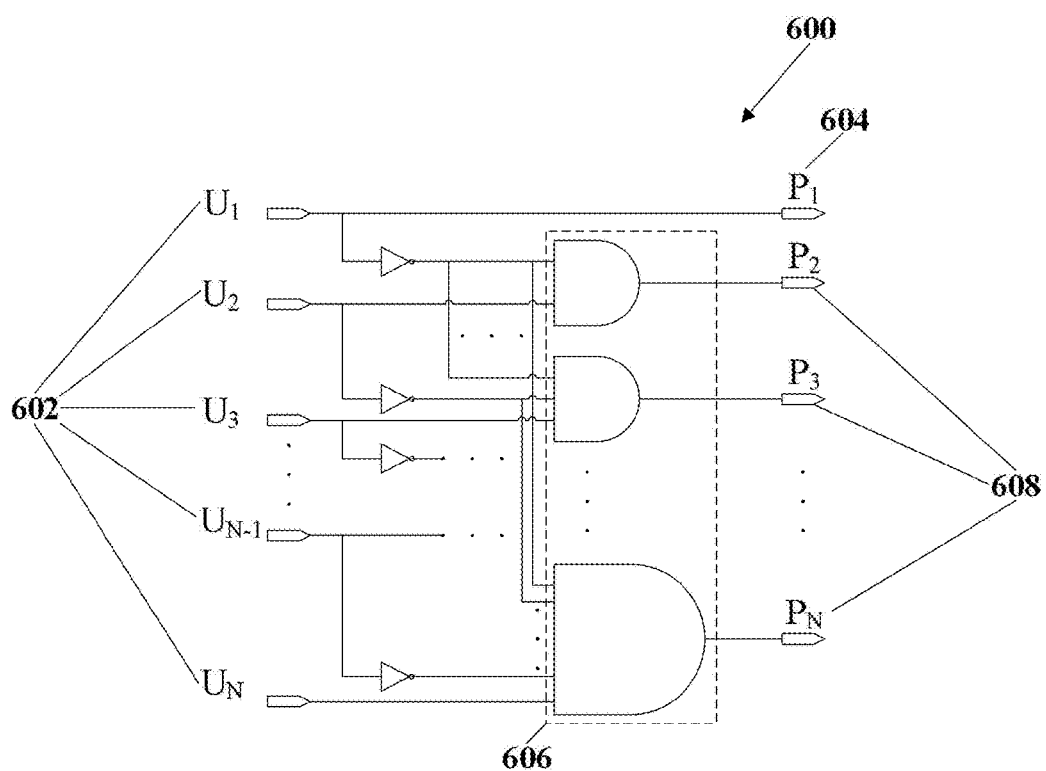
FIG. 6 illustrates a schematic of one example priority unit for the plurality voter circuit with N inputs, according to one or more implementations of the present disclosure.

In FIG. 6, a schematic of one implementation of the priority unit 600 for the plurality voter circuit with N inputs is depicted. The priority unit 600 may determine the priority of different elements of the input array 102 in the voting result selection, when there are two or more elements with equal number of plurality votes. Inputs of the priority unit 600 may include a plurality of priority inputs 602, including the control unit outputs 104, $U_1$-$U_N$. Each element of the plurality of priority inputs 602 may be the corresponding voter output 514 ($U_i$) where i refers to the $X_i$ element of the input array 102. One example of the plurality of priority inputs, for example $U_1$, may be connected to an output of the priority unit 600, for example $P_1$, which may be referred to as a priority output 604. The plurality of priority outputs 608 may represent an element of the input array 102, for example $X_i$ that has the highest priority among the elements of the input array 102.

In one implementation, the priority unit 600 may include an AND gate, for example a ninth AND gate 606. Inputs of implementations of the ninth AND gate 606 may include one of the plurality of priority inputs 602 ($U_i$) where 2<i<N, and a number of inverted values of the plurality of priority inputs 602. There may exist N−1 implementations of the ninth AND gate 606, corresponding to $X_2$-$X_N$ of the input array 102. The output of each implementation of the ninth AND gate 606 may be an element of a plurality of priority outputs 608, $P_2$-$P_N$. Each element $P_i$ of the plurality of priority outputs 608 may be logic 1 if all of the inverted values of the plurality of priority inputs 602 that are loaded to the corresponding implementation of the ninth AND gate 606 are logic 1, and the corresponding element of the plurality of priority inputs 602 $U_i$ is also logic 1. In other words, $U_i$ may have a lower priority than the inverted elements of the plurality of priority inputs 602 that are loaded to the ninth AND gate 606. Therefore, an $X_i$ element of the input array 102 that corresponds to $U_i$ may have a lower priority than another $X_m$ element that corresponds to $U_m$ which is inverted and loaded to the ninth AND gate 606, As a result, in different implementations, only one element with the highest priority among $P_1$-$P_N$ may be logic 1, and all other elements may be logic zero, unlike the plurality of priority inputs 602 $U_1$-$U_N$ that may have multiple elements being logic 1.

Figure 7:
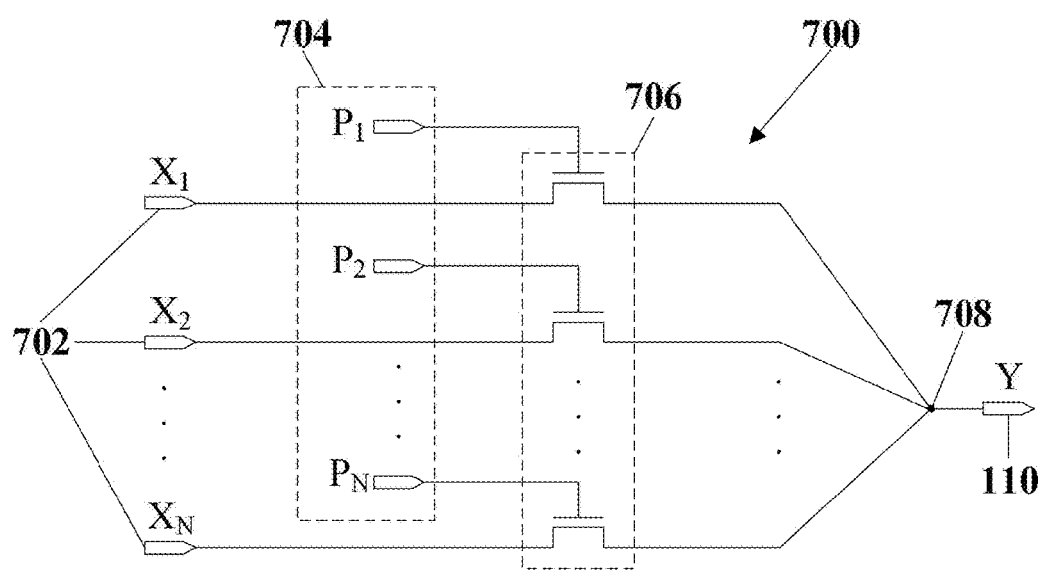
FIG. 7 illustrates a schematic of one example bypass unit for the plurality voter circuit with N inputs, according to one or more implementations of the present disclosure.

Referring again to FIG. 1, it can be understood that each element of the plurality of priority elements may be an element of the priority unit output 106. As shown in FIG. 1, the priority unit output 106 and the input array 102 may be loaded to the bypass unit 700. FIG. 7 shows a schematic of one example of the bypass unit 700 for the plurality voter circuit with N inputs. Inputs of the bypass unit 700 may include a first plurality of bypass inputs 702 that consist of the input array 102 ($X_1$-$X_N$). Inputs of the bypass unit 700 may also include a second plurality of bypass inputs 702 that include the priority output 604 ($P_1$) and the plurality of priority outputs 608 ($P_2$-$P_N$). The bypass unit 700 may include a plurality of pass-transistors 706. The source of each of the plurality of pass-transistors 706 may be connected to one element $X_i$ of the first plurality of bypass inputs 702, and the gate of each of the plurality of pass-transistors 706 may be connected to one element $P_i$ of the second plurality of bypass inputs 702 that corresponds to $X_i$. The drains of the plurality of pass-transistors 706 may be connected to a common node 708 that is directly connected to the output 110. Since only one element of the second plurality of bypass inputs 702 ($P_1$-$P_N$), for example $P_i$, may be logic 1 at a time (according to the processing of the priority unit 600), only one of the plurality of pass-transistors 706 may be active at a time. The active transistor may correspond to the element in the first plurality of bypass inputs 702 (that is also an element of the input array 102) with the highest plurality of Votes and highest priority, for example $X_i$. Hence, the voltage of $X_i$ may be transferred via the corresponding element of the plurality of pass-transistors 706 to the common node 708 and consequently, to the output 110. As a result, the value of an element in the input array 102 with the highest plurality of votes and highest priority may be transferred to the output 110.

In different implementations, hardware of the bypass transistors and logic elements of the plurality Voter circuit 100 may be implemented by using various transistor technologies, including but not limited to, metal-oxide-semiconductor field-effect transistor (MOSFET) technology, or a carbon nanotube field-effect transistor (CNTFET) technology, or a fin field-effect transistor (FinFET) technology.

EXAMPLE

Simulations of Plurality Voter Circuits

In this example, different elements of an example plurality voter circuit of the present disclosure were simulated for N=5 inputs at the transistor level by using HSPICE simulation software. Different transistor technologies were used for simulation examples. An example plurality voter circuit was simulated in transistor level in HSPICE by using a 32 nm MOSFET transistor model. The threshold voltage $V_{th}$ was set to about 50 mv.

Figure 8A:
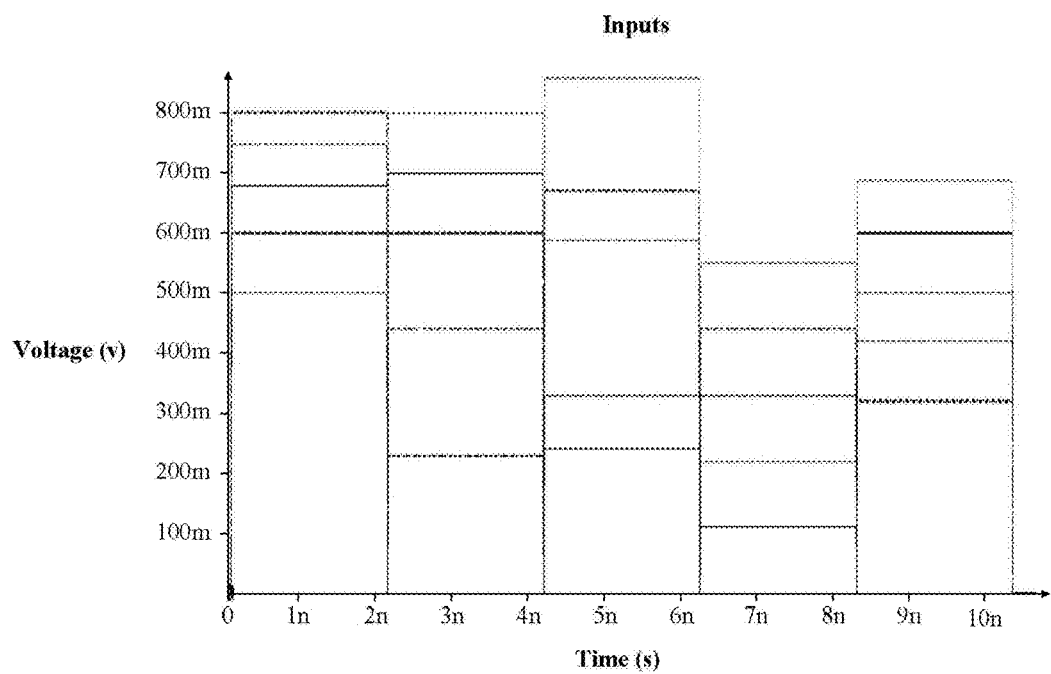
FIG. 8A illustrates the variations associated with 5 input voltages applied, to an example simulated plurality voter circuit with 32 nm MOSFET transistors, according to one or more implementations of the present disclosure.
Figure 8B:
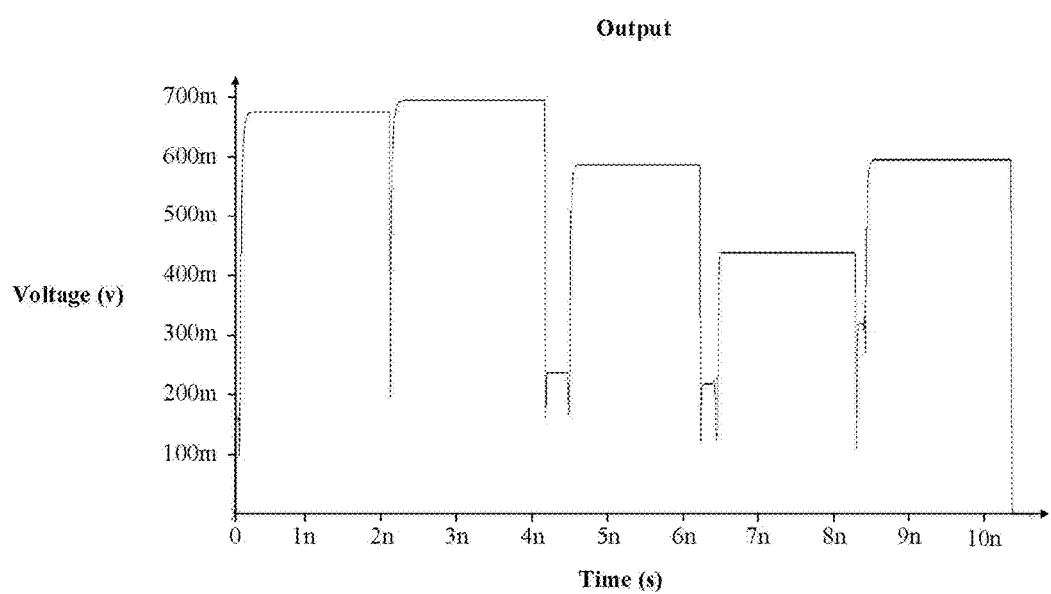
FIG. 8B illustrates the variations associated with an output voltage of an example simulated plurality voter circuit with 32 nm MOSFET transistors, according to one or more implementations of the present disclosure.

FIG. 8A depicts the variations of 5 input voltages applied to the simulated plurality voter circuit with 32 nm MOSFET transistors. The voting output is illustrated in FIG. 8B. It can be seen that the simulation results are consistent with the theoretical results, which validates the circuit performance.

Figure 9A:
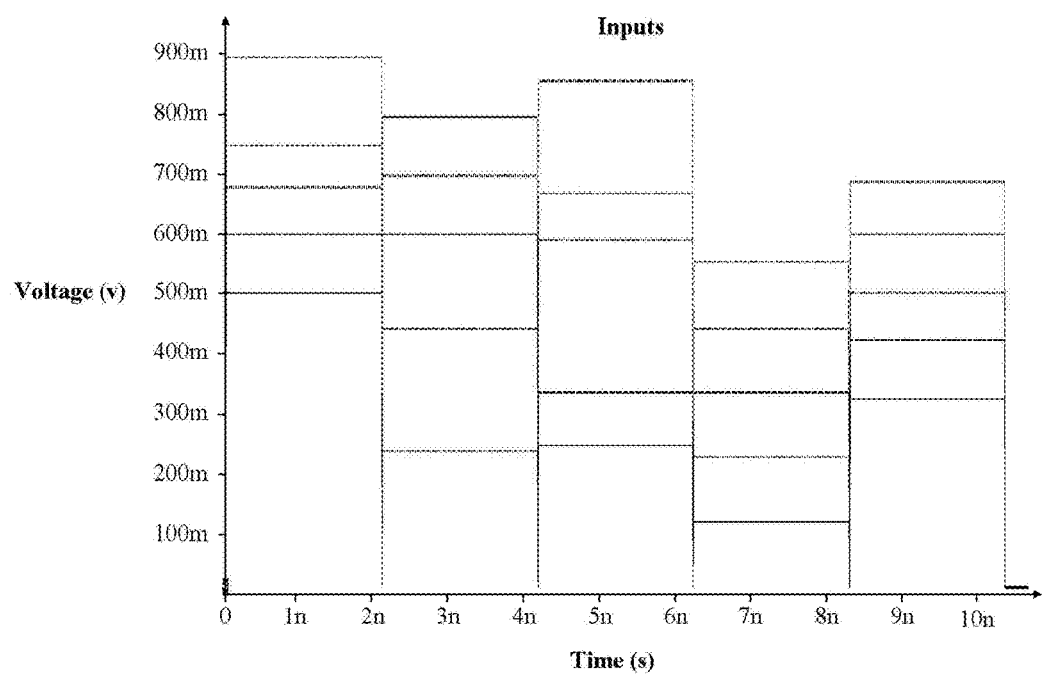
FIG. 9A illustrates the variations associated with 5 input voltages applied to an example simulated plurality voter circuit with 32 nm CNFET transistors, according to one or more implementations of the present disclosure.
Figure 9B:
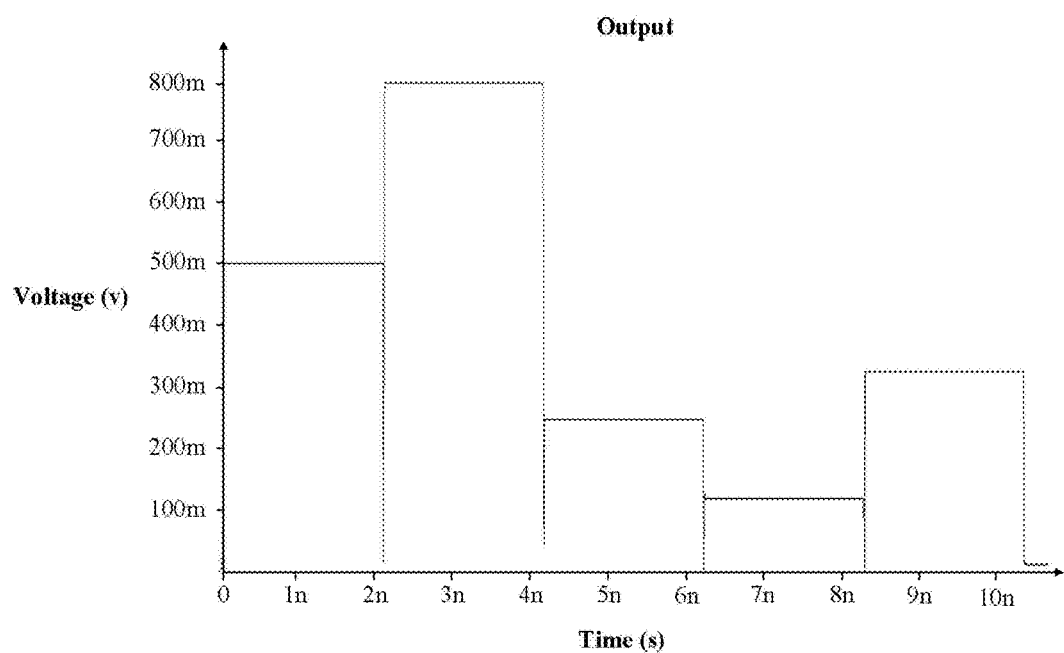
FIG. 9B illustrates the variations associated with an output voltage of an example simulated plurality voter circuit with 32 nm CNFET transistors, according to one or more implementations of the present disclosure.

Another example plurality voter circuit was simulated in transistor level in HSPICE by using a 32 nm CNFET transistor model. The threshold voltage was set to about 50 mv, and the temperature was set at about 27° C. FIG. 9A depicts the variations of 5 input voltages applied to the simulated plurality voter circuit with 32 nm CNFET transistors. The voting output is illustrated in FIG. 9B. It can be seen that the simulation results are consistent with the theoretical results, which validates the circuit performance.

Figure 10:
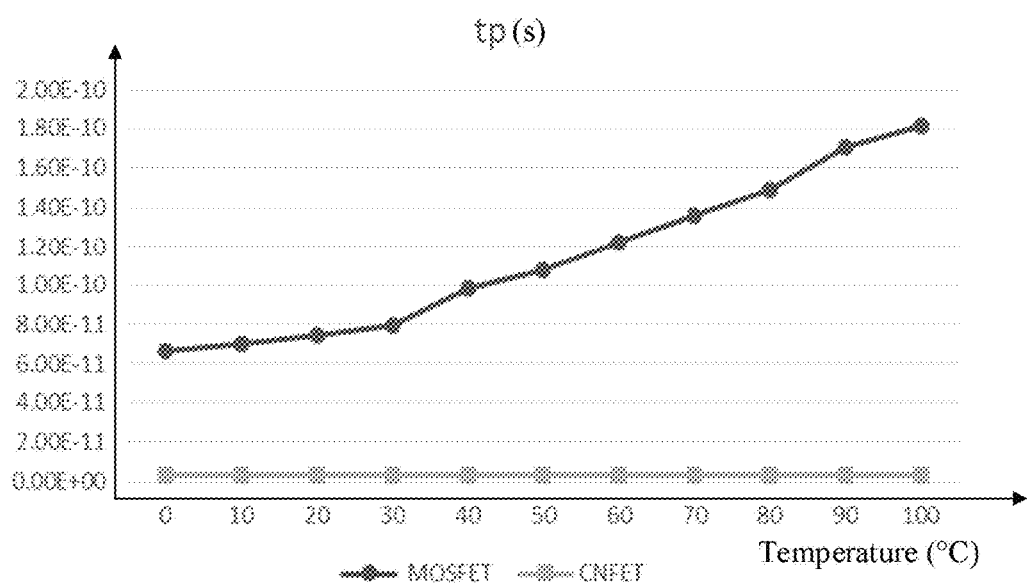
FIG. 10 illustrates delay variations associated with temperature for two examples of MOSFET and CNFET plurality voting circuits, according to one or more implementations of the present disclosure.

FIG. 10 is a graph depicting delay variations (tp) with temperature for some example MOSFET and CNFET plurality voting circuits. As shown in FIG. 10, output delay of the example MOSFET plurality voting circuit increases as the temperature is raised, while the output delay of the example CNFET plurality voting circuit remains negligible.

Figure 11:
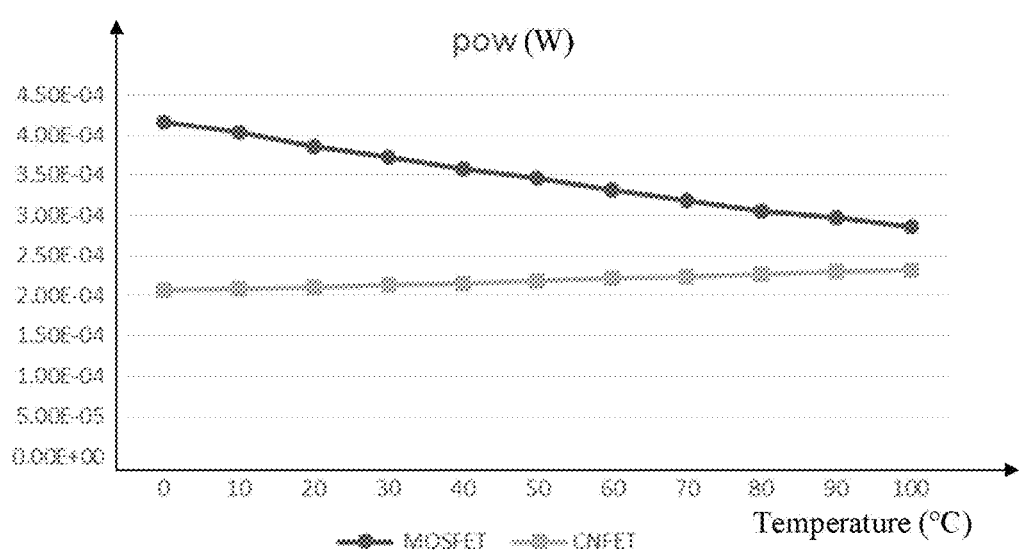
FIG. 11 illustrates variations associated with power consumption and temperature for two examples of MOSFET and CNFET plurality voting circuits, according to one or more implementations of the present disclosure.

FIG. 11 is a graph depicting variations of power consumption (pow) with temperature for some example MOSFET and CNFET plurality voting circuits. As shown in FIG. 11, power consumption of the example MOSFET plurality voting circuit remains higher than power consumption of the example CNFET plurality voting circuit for the entire range of 0-100° C.

Figure 12:
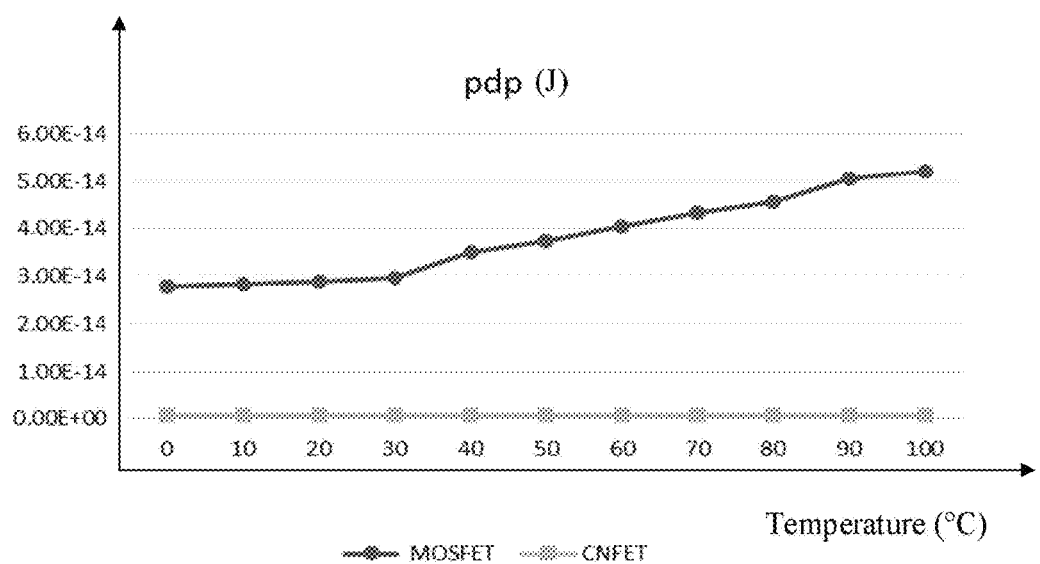
FIG. 12 illustrates variations of power delay product with temperature for two examples of MOSFET and CNFET plurality voting circuits, according to one or more implementations of the present disclosure.

FIG. 12 is a graph depicting variations of power delay product (pdp) with temperature, for example MOSFET and CNFET plurality voting circuits. As shown in this figure, pdp of the example MOSFET plurality voting circuit increases as the temperature is raised, but the pdp of the example CNFET plurality voting circuit remains negligible.

The results of FIGS. 10-12 indicate that the performance of the plurality voter circuit based on carbon nanotube transistors CNFET may be better than that of MOSFET transistor-based plurality voter circuit in terms of delay and power consumption.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain, The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A plurality voter circuit comprising:
    an input array including a plurality of elements, each element being associated with a number of votes;
    an output, wherein the output comprises at least one element of the plurality of elements that is associated with a greatest number of votes relative to other elements in the plurality of elements;
    a control unit, wherein the input array is loaded into the control unit, the control unit comprising:
        a comparator unit, wherein the input array is loaded into the comparator unit, the comparator unit including:
            a first comparator circuit for a first pair of elements from the input array;
            a second comparator circuit for a second pair of elements from the input array;
            a third comparator circuit for a third pair of elements from the input array; and
            a fourth comparator circuit for a fourth pair of elements from the input array; and
        a counter unit, comprising:
            a first counter circuit for a first element of the input array;
            a second counter circuit for a second element of the input array; and
        a voter unit, comprising a voter circuit for each element of the input array;
        wherein the comparator unit, the counter unit, and the voter unit are electrically connected;
    a priority unit and
    a bypass unit, wherein the input array is loaded into the bypass unit, and the output comprises the bypass unit output, and wherein the control unit, the priority unit, and the bypass unit are electrically connected.

2. The plurality voter circuit of claim 1, wherein the first comparator circuit comprises:
    the first pair of elements from the input array, including a first comparator input and a second comparator input;
    two op-amps, including:
        a first op-amp, wherein a first reference signal and an average of the first comparator input and the second comparator input are loaded to the first op-amp;
        a second op-amp, wherein a second reference signal and an average of the first comparator input and the second comparator input are loaded to the second op-amp;
    a first two-input NAND gate, wherein inputs of the first two-input NAND gate include first op-amp output and second op-amp output; and
    a first comparator output, including a first two-input NAND gate output.

3. The plurality voter circuit of claim 2, wherein the first reference signal comprises a sum of the first comparator input and the threshold signal.

4. The plurality voter circuit of claim 3, wherein the second reference signal comprises a sum of the second comparator input and the threshold signal.

5. The plurality voter circuit of claim 3, wherein the second comparator circuit comprises:
    the second pair of elements from the input array, including the first comparator input and a third comparator input;
    two op-amps, including:
        a third op-amp, wherein the first reference signal and an average of the first comparator input and the third comparator input are loaded to the third op-amp;
        a fourth op-amp, wherein a third reference signal and an average of the first comparator input and the third comparator input are loaded to the fourth op-amp;
    a second two-input NAND gate, wherein inputs of the second two-input NAND gate include third op-amp output and fourth op-amp output; and
    a second comparator output, including a second two-input NAND gate output.

6. The plurality voter circuit of claim 5, wherein the third reference signal comprises a sum of the threshold signal and the third comparator input.

7. The plurality voter circuit of claim 5, wherein the third comparator circuit comprises:
    the third pair of elements from the input array, including a fourth comparator input and a fifth comparator input;
    two op-amps, including:
        a fifth op-amp, wherein a fourth reference signal and an average of the fourth comparator input and the fifth comparator input are loaded to the fifth op-amp; and
        a sixth op-amp, wherein a fifth reference signal and an average of the fourth comparator input and the fifth comparator input are loaded to the sixth op-amp;
    a third two-input NAND gate, wherein inputs of the third two-input NAND gate include fifth op-amp output and sixth op-amp output; and
    a third comparator output, including a third two-input NAND gate output.

8. The plurality voter circuit of claim 7, wherein the fourth reference signal comprises a sum of the threshold signal and the fourth comparator input.

9. The plurality voter circuit of claim 7, wherein the fifth reference signal comprises a sum of the threshold signal and the fifth comparator input.

10. The plurality voter circuit of claim 7, wherein the fourth comparator circuit comprises:
    the fourth pair of elements from the input array, including the fourth comparator input and a sixth comparator input;
    two op-amps, including:
        a seventh op-amp, wherein the fourth reference signal and an average of the fourth comparator input and the sixth comparator input are loaded to the seventh op-amp;

an eighth op-amp, wherein a sixth reference signal and an average of the fourth comparator input and the sixth comparator input are loaded to the eighth op-amp;

a fourth two-input NAND gate, wherein inputs of the fourth two-input NAND gate include seventh op-amp output and eighth op-amp output; and a fourth comparator output, including a fourth two-input NAND gate output.

11. The plurality voter circuit of claim 10, wherein the sixth reference signal includes a sum of the threshold signal and the sixth counter input.

12. The plurality voter circuit of claim 10, wherein the first counter circuit comprises:

a first plurality of counter inputs, including the first comparator output and the second comparator output;

a first AND gate, wherein inputs of the first AND gate include the first plurality of counter inputs;

a second AND gate, wherein inputs of the second AND gate include between at least half of the first plurality of counter inputs and less than a total of the first plurality of counter inputs;

a first OR gate, wherein inputs of the first OR gate include the second AND gate output;

a second OR gate, wherein inputs of the second OR gate include the first plurality of counter inputs;

a first plurality of counter outputs, including a first AND gate output and a first OR gate output; and a first counter output, including the second OR gate output.

13. The plurality voter circuit of claim 12, wherein the first counter circuit further comprises:

a third AND gate, wherein inputs of the third AND gate include between at least two of the first plurality of counter inputs and less than half of the first plurality of counter inputs;

a third OR gate, wherein inputs of the third OR gate include the third AND gate output; and a second counter output, including the third OR gate output.

14. The plurality voter circuit of claim 13, wherein the second counter circuit comprises:

a second plurality of counter inputs, including the third comparator output and the fourth comparator output;

a fourth AND gate, wherein inputs of the fourth AND gate include the second plurality of counter inputs;

a fifth AND gate, wherein inputs of the fifth AND gate include between at least two of the second plurality of counter inputs and less than a total of the second plurality of counter inputs;

a fourth OR gate, wherein inputs of the fourth OR gate include the fifth AND gate output;

a fifth OR gate, wherein inputs of the fifth OR gate include the second plurality of counter inputs;

a third counter output, including the fourth AND gate output;

a fourth counter output, including the fourth OR gate output; and a fifth counter output, including the fifth OR gate output.

15. The plurality voter circuit of claim 14, wherein the second counter circuit further comprises:

a sixth AND gate comprising more inputs than the inputs of the third AND gate inputs, wherein the inputs of the sixth AND gate include three or more of the second plurality of counter inputs;

a sixth OR gate, wherein the inputs of the sixth OR gate include sixth AND gate output; and a sixth counter output, including sixth OR gate output.

16. The plurality voter circuit of claim 15, wherein the voter circuit comprises:

a first plurality of voter inputs, including the first plurality of counter outputs;

a second plurality of voter inputs, including the third counter output and the fourth counter output;

a first voter input, including the first counter output;

a first NOR gate, wherein inputs of the first NOR gate include the second plurality of voter inputs;

a seventh AND gate, wherein inputs of the seventh AND gate include the first NOR gate output and the first voter input;

a seventh OR gate wherein inputs of the seventh OR gate include the first plurality of voter inputs and the seventh AND gate output; and a voter output including seventh OR gate output.

17. The plurality voter circuit of claim 16, wherein the voter circuit further comprises:

a second voter input, including the second counter output;

a third voter input, including the sixth counter output;

a second NOR gate, wherein inputs of the second NOR gate include the third voter input; and an eighth AND gate, wherein inputs of the eighth AND gate include the second NOR gate output and the second voter input.

18. The plurality voter circuit of claim 17, wherein inputs of the seventh OR gate further include output of the eighth AND gate.

19. The plurality voter circuit of claim 16, wherein the priority unit comprises:

a plurality of priority inputs, including the voter output;

a priority output, including one of the plurality of priority inputs;

a ninth AND gate, wherein inputs of the ninth AND gate include one of the plurality of priority inputs, and a number of inverted values of the plurality of priority inputs; and a plurality of priority outputs, including output of the ninth AND gate.

20. The plurality voter circuit of claim 19, wherein the bypass unit comprises:

a first plurality of bypass inputs, including the input array;

a second plurality of bypass inputs, including the priority output and the plurality of priority outputs;

a plurality of pass-transistors; and a common node connected to drains of the plurality of pass-transistors.

21. The plurality voter circuit of claim 20, wherein each of the first plurality of bypass inputs is connected to a source of each of the plurality of pass-transistors.

22. The plurality voter circuit of claim 20, wherein each of the second plurality of bypass inputs is connected to a gate of each of the plurality of pass-transistors.

23. The plurality voter circuit of claim 20, wherein the common node is connected to the output.

24. The plurality voter circuit of claim 20, wherein the plurality voter circuit components include a metal-oxide-semiconductor field-effect transistor (MOSFET), a carbon nanotube field-effect transistor (CNTFET), or a fin field-effect transistor (FinFET).

* * * * *